(12) United States Patent
Cheng et al.

(10) Patent No.: US 10,727,340 B2
(45) Date of Patent: Jul. 28, 2020

(54) STRAINED STRUCTURE OF A SEMICONDUCTOR DEVICE

(71) Applicant: TAIWAN SEMICONDUCTOR MANUFACTURING COMPANY, LTD., Hsinchu (TW)

(72) Inventors: Chun-Fai Cheng, Tin Shui Wai (HK); Ka-Hing Fung, Zhudong Township (TW); Li-Ping Huang, Taipei (TW); Wei-Yuan Lu, Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 10 days.

(21) Appl. No.: 15/633,250

(22) Filed: Jun. 26, 2017

(65) Prior Publication Data

US 2017/0301794 A1    Oct. 19, 2017

Related U.S. Application Data

(62) Division of application No. 12/984,703, filed on Jan. 5, 2011, now Pat. No. 9,698,054.

(Continued)

(51) Int. Cl.
*H01L 29/66* (2006.01)
*H01L 29/78* (2006.01)
(Continued)

(52) U.S. Cl.
CPC .... *H01L 29/7848* (2013.01); *H01L 21/02532* (2013.01); *H01L 21/02636* (2013.01);
(Continued)

(58) Field of Classification Search
CPC .............. H01L 29/66636; H01L 29/66545
See application file for complete search history.

(56) References Cited

U.S. PATENT DOCUMENTS

| 6,225,173 B1 | 5/2001 | Yu |
| 6,335,248 B1 | 1/2002 | Mandelman et al. |

(Continued)

FOREIGN PATENT DOCUMENTS

| CN | 101572269 | 11/2009 |
| TW | I299514 | 8/2008 |

OTHER PUBLICATIONS

Office Action dated May 14, 2014 from corresponding application No. TW 100109395.

(Continued)

*Primary Examiner* — David Vu
(74) *Attorney, Agent, or Firm* — Hauptman Ham, LLP

(57) ABSTRACT

A p-type field effect transistor includes a pair of spacers over a substrate top surface. The p-type field effect transistor includes a channel recess cavity in the substrate top surface between the pair of spacers. The p-type field effect transistor includes a gate stack with a bottom portion in the channel recess cavity. The p-type field effect transistor includes a source/drain (S/D) recess cavity including a bottom surface and sidewalls below the substrate top surface, wherein the S/D recess cavity includes a portion extending below the gate stack. The p-type field effect transistor includes a strained material filling the S/D recess cavity. The p-type field effect transistor further includes a source/drain (S/D) extension substantially conformably surrounding the bottom surface and sidewalls of the S/D recess cavity. The S/D extension includes a portion between the gate stack and the S/D recess cavity.

20 Claims, 6 Drawing Sheets

Related U.S. Application Data

(60) Provisional application No. 61/394,440, filed on Oct. 19, 2010.

(51) Int. Cl.
| | |
|---|---|
| *H01L 21/8234* | (2006.01) |
| *H01L 21/8238* | (2006.01) |
| *H01L 21/02* | (2006.01) |
| *H01L 21/324* | (2006.01) |
| *H01L 29/08* | (2006.01) |
| *H01L 29/10* | (2006.01) |
| *H01L 29/165* | (2006.01) |
| *H01L 29/423* | (2006.01) |
| *H01L 29/49* | (2006.01) |
| *H01L 29/51* | (2006.01) |

(52) U.S. Cl.
CPC .... *H01L 21/324* (2013.01); *H01L 21/823412* (2013.01); *H01L 21/823425* (2013.01); *H01L 21/823807* (2013.01); *H01L 21/823814* (2013.01); *H01L 29/0847* (2013.01); *H01L 29/1033* (2013.01); *H01L 29/165* (2013.01); *H01L 29/42368* (2013.01); *H01L 29/66545* (2013.01); *H01L 29/66621* (2013.01); *H01L 29/66636* (2013.01); *H01L 29/495* (2013.01); *H01L 29/4958* (2013.01); *H01L 29/4966* (2013.01); *H01L 29/513* (2013.01); *H01L 29/517* (2013.01); *H01L 29/66628* (2013.01)

(56) References Cited

U.S. PATENT DOCUMENTS

| | | | |
|---|---|---|---|
| 6,716,046 | B2 | 4/2004 | Mistry |
| 7,091,071 | B2 | 8/2006 | Thean et al. |
| 7,459,752 | B2 * | 12/2008 | Doris ................. H01L 29/66545 257/327 |
| 7,579,248 | B2 | 8/2009 | Huang et al. |
| 7,858,481 | B2 | 12/2010 | Brask et al. |
| 7,964,487 | B2 * | 6/2011 | Cheng ............. H01L 21/823807 257/E21.444 |
| 8,022,488 | B2 | 9/2011 | Cheng et al. |
| 8,138,552 | B2 | 3/2012 | Matsuo |
| 8,242,558 | B2 * | 8/2012 | Yamakawa ....... H01L 29/66545 257/330 |
| 8,253,204 | B2 * | 8/2012 | Lee .................... H01L 29/0847 257/288 |
| 2006/0286755 | A1 | 12/2006 | Brask et al. |
| 2009/0095992 | A1 * | 4/2009 | Sanuki .............. H01L 21/28518 257/288 |
| 2009/0189203 | A1 | 7/2009 | Matsuo |
| 2009/0302412 | A1 * | 12/2009 | Cheng ............. H01L 21/823807 257/506 |
| 2011/0306170 | A1 | 12/2011 | Wang et al. |

OTHER PUBLICATIONS

Office Action dated Apr. 1, 2013 from corresponding application No. CN201110317907.7.

* cited by examiner

STRAINED STRUCTURE OF A SEMICONDUCTOR DEVICE

PRIORITY CLAIM

The present application is a divisional of U.S. application Ser. No. 12/984,703, filed Jan. 5, 2011, which claims the priority of U.S. Provisional Application No. 61/394,440, filed Oct. 19, 2010, which are incorporated herein by reference in their entireties.

TECHNICAL FIELD

The disclosure relates to integrated circuit fabrication, and more particularly, to a strained source/drain structure.

BACKGROUND

When a semiconductor device, such as a metal-oxide-semiconductor field-effect transistor (MOSFET), is scaled down through various technology nodes, high-k gate dielectric layer and metal gate electrode layer are incorporated into the gate stack of the MOSFET to improve device performance with the decreased feature sizes. In addition, strained materials in source/drain (S/D) recess cavities of the MOSFET utilizing selectively grown silicon germanium (SiGe) may be used to enhance carrier mobility.

However, there are challenges to implement such features and processes in complementary metal-oxide-semiconductor (CMOS) fabrication. As the gate length and spacing between devices decrease, these problems are exacerbated. For example, it is difficult to achieve an enhanced carrier mobility for a p-type field effect transistor because strained materials cannot deliver a given amount of strain into the channel region of the p-type field effect transistor, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
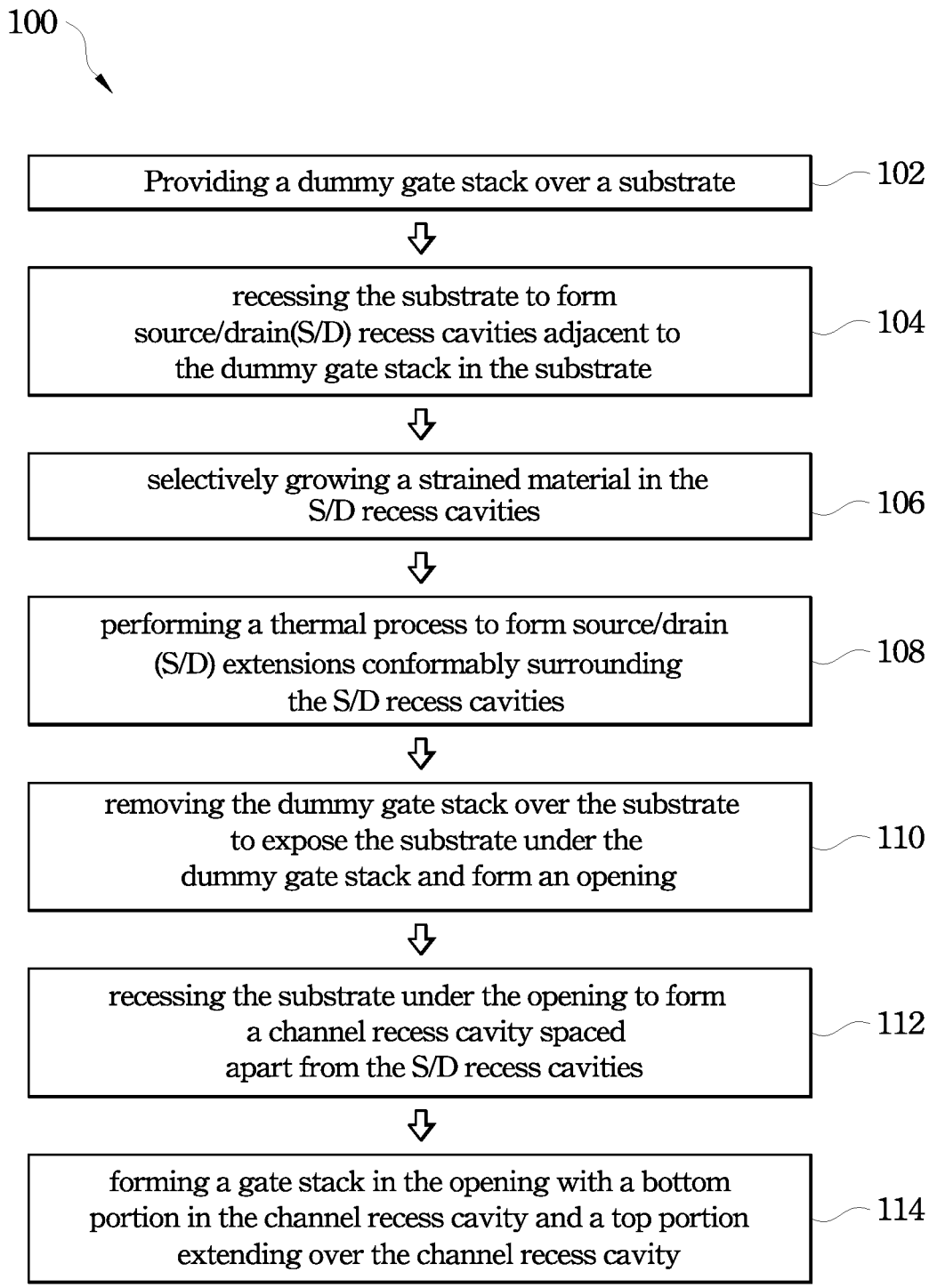
FIG. 1 is a flowchart illustrating a method for fabricating a p-type field effect transistor comprising a strained source/drain structure according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for simplicity and clarity. In addition, the present disclosure provides examples based on a "gate last" metal gate structure, however, one skilled in the art may recognize applicability to other structures and/or use of other materials.

FIG. 1 is a flowchart illustrating a method 100 for fabricating a p-type field effect transistor 200 comprising a strained source/drain structure according to various aspects of the present disclosure. FIGS. 2-8B show schematic cross-sectional views of a strained source/drain structure of a p-type field effect transistor 200 at various stages of fabrication according to various aspects of the present disclosure. The method of FIG. 1 does not produce a completed p-type field effect transistor. Accordingly, it is understood that additional processes may be provided before, during, and after the method 100 of FIG. 1, and that some other processes may only be briefly described herein. Also, FIGS. 2 through 8B are simplified for a better understanding of various concepts of the present disclosure. For example, although the figures illustrate the strained source/drain structure for the p-type field effect transistor 200, it is understood a p-type field effect transistor fabricated using methods in accordance with one or more embodiments of the disclosure may be part of an integrated circuit (IC) that may include a number of other devices including n-type field effect transistors, resistors, capacitors, inductors, fuses, etc.

Figure 2:
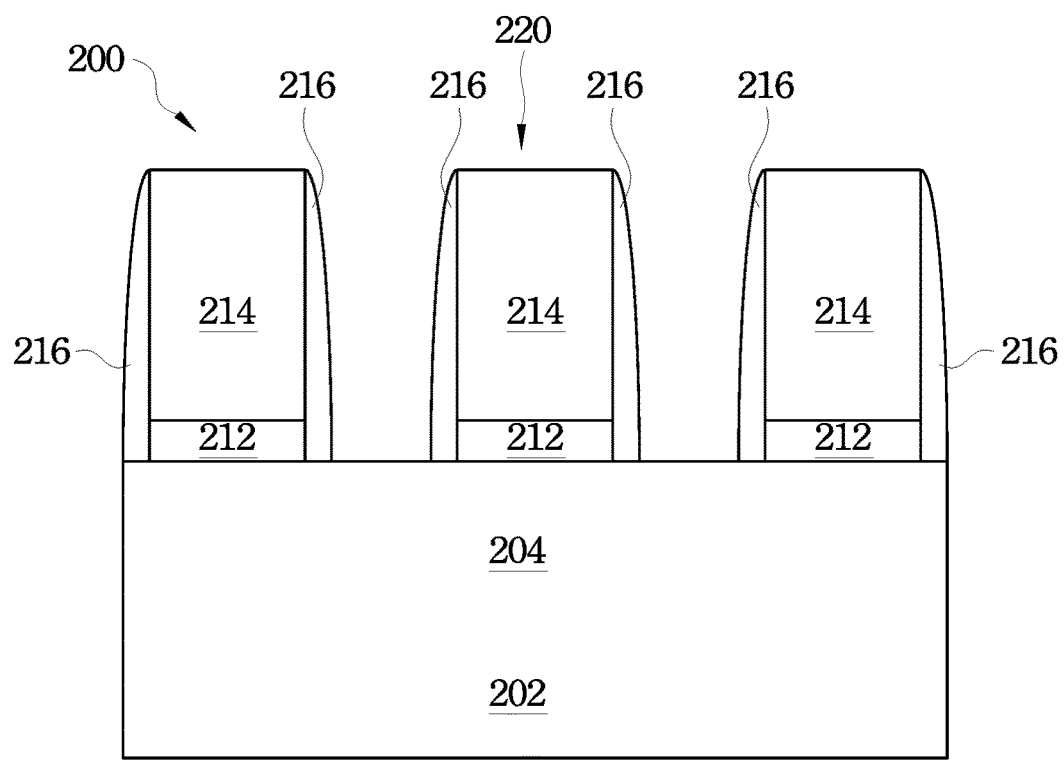
FIGS. 2-8B show schematic cross-sectional views of a strained source/drain structure of a p-type field effect transistor at various stages of fabrication according to various aspects of the present disclosure.

Referring to FIGS. 1 and 2, the method 100 begins at step 102 wherein a dummy gate stack 220 over a substrate 202 is provided. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI) or silicon on sapphire. In other embodiments, the substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 202 may comprise a multilayer silicon structure or a silicon substrate may include a multilayer compound semiconductor structure. The substrate 202 comprises a top surface 202s.

The substrate 202 may further comprise an active region 204 and isolation regions (not shown). The active region 204 may include various doping configurations depending on design requirements as known in the art. In the present embodiment, the active region 204 may be doped with n-type dopants, such as phosphorus or arsenic, and/or combinations thereof. The active region 204 is configured for the p-type field effect transistor 200 according to various aspects of the present disclosure.

The isolation regions (not shown) may be formed on the substrate 202 to isolate the various active regions 204. The isolation regions may utilize isolation technology, such as local oxidation of silicon (LOCOS) or shallow trench isolation (STI), to define and electrically isolate the various active regions 204. In the present embodiment, the isolation region includes a STI. The isolation regions may comprise silicon oxide, silicon nitride, silicon oxynitride, fluoride-doped silicate glass (FSG), a low-K dielectric material, other suitable materials, and/or combinations thereof. The isolation regions, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition (CVD) process) with a dielectric material. In some embodiments, the filled trench may have a multi-layer structure such as a thermal oxide liner layer filled with silicon nitride or silicon oxide.

Then, a dummy gate dielectric layer 212 is formed over the substrate 202 for reducing damage on the substrate top surface 202s created by an opening-etch process as described later with respect to FIG. 6. In some embodiments, the dummy gate dielectric layer 212 may comprise silicon oxide, silicon oxy-nitride, or combination thereof. The dummy gate dielectric layer 212 may be grown by a thermal oxidation process or deposited by a CVD process or an atomic layer deposition (ALD) process, and may have a thickness less than 2 nm.

A dummy gate electrode layer 214 may be formed over the dummy gate dielectric layer 212. In some embodiments, the dummy gate electrode layer 214 may comprise a single layer or multilayer structure. In the present embodiment, the dummy gate electrode layer 214 may comprise poly-silicon. Further, the dummy gate electrode layer 214 may be doped poly-silicon with the uniform or gradient doping. The dummy gate electrode layer 214 may have any suitable thickness. In the present embodiment, the dummy gate electrode layer 214 has a thickness in the range of about 30 nm to about 80 nm. The dummy gate electrode layer 214 may be formed by depositing a blanket layer of material using a low-pressure chemical vapor deposition (LPCVD) process or a physical vapor deposition (PVD) process.

The blanket layer of material of dummy gate electrode layer 214 and the dummy gate dielectric layer 212 are patterned to produce a dummy gate stack 220. A photosensitive layer (not shown) is formed over the dummy gate electrode layer 214 by a suitable process, such as spin-on coating, and patterned to form a patterned feature over the dummy gate electrode layer 214 by a proper lithography patterning method. A width of the patterned feature is in the range of about 15 to 45 nm. The patterned feature can then be transferred using a dry etching process to the underlying layers (i.e., the dummy gate dielectric layer 212 and the dummy gate electrode layer 214) to form the dummy gate stack 220. The photosensitive layer may be stripped thereafter.

In another example, a hard mask layer (not shown) may be formed over the dummy gate electrode layer 214 to protect the dummy gate electrode layer 214. The hard mask layer comprises silicon oxide. Alternatively, the hard mask layer may optionally comprise silicon nitride, and/or silicon oxy-nitride, and may be formed using a method such as CVD or PVD. The hard mask layer comprises a thickness in the range from about 100 to 800 angstroms. After the hard mask layer is deposited, the hard mask layer is patterned using a photosensitive layer (not shown). Then the dummy gate stack 220 is patterned through the hard mask layer, the dummy gate electrode layer 214, and the gate dielectric layer 212 using a reactive-ion-etching (RIE) or a high-density-plasma (HDP) process, exposing a portion of the substrate 202.

Still referring to FIG. 2, the p-type field effect transistor 200 further includes a dielectric layer formed over the substrate 202 and the dummy gate stack 220. The dielectric layer may include silicon oxide, silicon nitride, silicon oxy-nitride, or other suitable material. The dielectric layer may comprise a single layer or multilayer structure. The dielectric layer may be formed by CVD, PVD, ALD, or other suitable technique. The dielectric layer includes a thickness ranging from about 5 to 15 nm. Then, an anisotropic etching is performed on the dielectric layer to form a pair of spacers 216 on two sides of the dummy gate stack 220.

Figure 3:
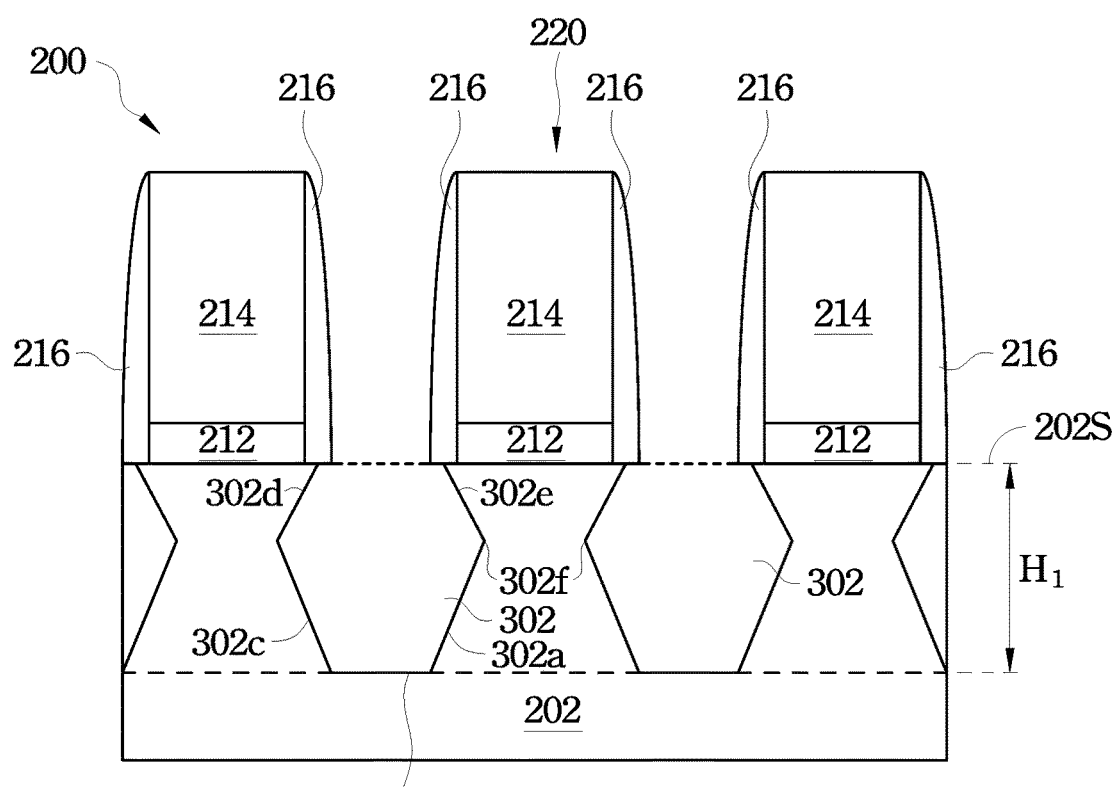

The method 100 in FIG. 1 continues with step 104 in which the structure in FIG. 3 is produced by recessing the substrate 202 to form source/drain (S/D) recess cavities 302 adjacent to the dummy gate stack 220 in the substrate 202. Using the pair of spacers 216 as hard masks, a wet etching process is performed to recess the top surface 202s of the substrate 202 that is unprotected or exposed to form the S/D recess cavities 302. In one embodiment, the wet etching process comprises recessing the substrate 202 to form source/drain (S/D) recess cavities 302 in a solution comprising tetramethyl-ammonium hydroxide (TMAH). In another embodiment, the wet etching process comprises recessing the substrate 202 to form source/drain (S/D) recess cavities 302 in a solution comprising KOH.

Also, in the embodiments provided, the wet etching process in the silicon substrate 202 may have higher etching rate in {100} and {110} family planes than etching rate in {111} family planes, resulting in faceted planes along the {111} family planes to form diamond-like S/D recess cavities 302. Thus, the diamond-like source/drain (S/D) recess cavity 302 is below the top surface 202s of the substrate 202. Further, the diamond-like S/D recess cavity 302 has a bottom surface 302b and sidewalls 302a, 302c, 302d, 302e. The sidewalls 302a, 302c, 302d, 302e may be angled with respect to the substrate surface 202s. In one embodiment, the sidewall 302e of the diamond-like S/D recess cavity 302 comprises a portion 302f down and inward extending below the dummy gate stack 220. In some embodiments, a height $H_1$ between the top surface 202s of the substrate 202 and the bottom surface 302b of the S/D recess cavity 302 is in the range of about 30 to 60 nm.

Figure 4:
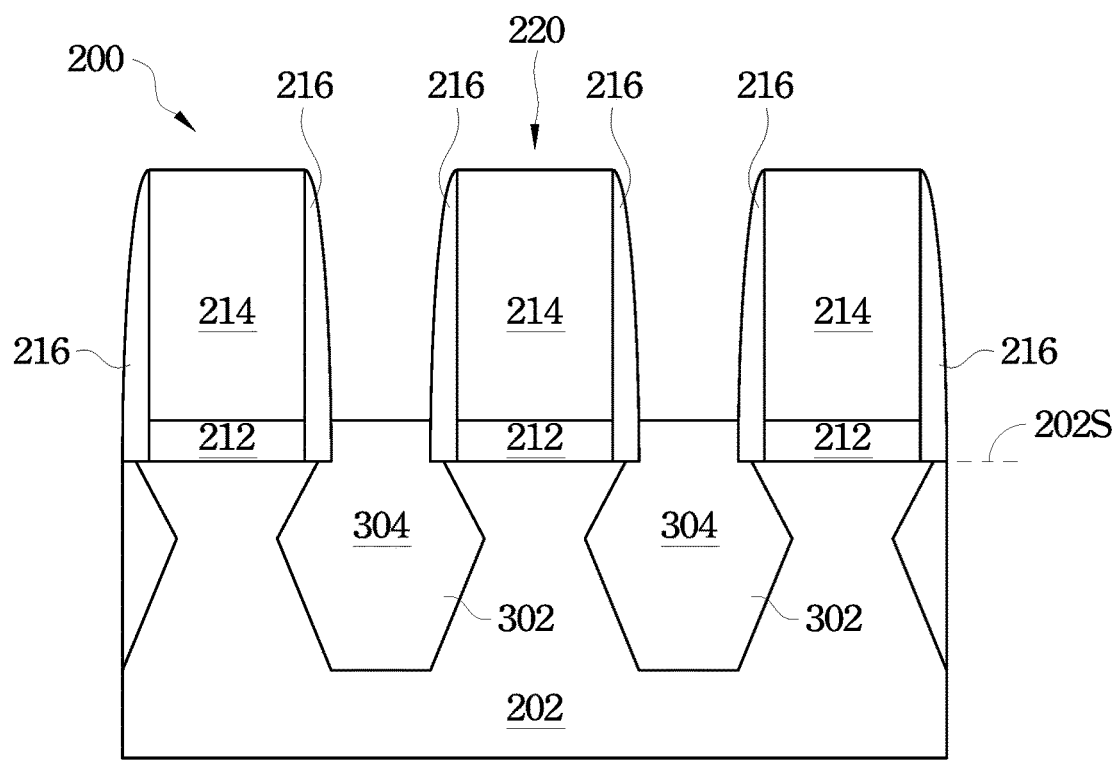

The method 100 in FIG. 1 continues with step 106 in which the structure in FIG. 4 is produced by selectively growing a strained material 304 in the S/D recess cavities 302. In the present embodiment, a pre-cleaning process may be performed to clean the S/D recess cavities 302 with HF or other suitable solution. And then, the strained material 304, such as silicon germanium (SiGe), is selectively grown by a low-pressure chemical vapor deposition (LPCVD) process in the S/D recess cavities 302 to form S/D regions of the p-type field effect transistor 200. The LPCVD process to form boron-doped strained material 304 is performed at a temperature of about 400 to 800° C. and under a pressure of about 1 to 200 Torr, using $SiH_2Cl_2$, $SiH_4$, $GeH_4$, $HCl$, $B_2H_6$, and $H_2$ as reaction gases. In one embodiment, the selective growth of the strained material 304 continues until the material 304 extends above the surface 202s of the substrate 202. In another embodiment, the selective growth of the strained material 304 is terminated while the strained material 304 does not extend above the surface 202s of the substrate 202. Since the lattice constant of the strained material 304 is different from the substrate 202, the channel region of the substrate 202 is strained or stressed to increase carrier mobility of the p-type field effect transistor 200 and enhance performance of the transistor.

Figure 5:
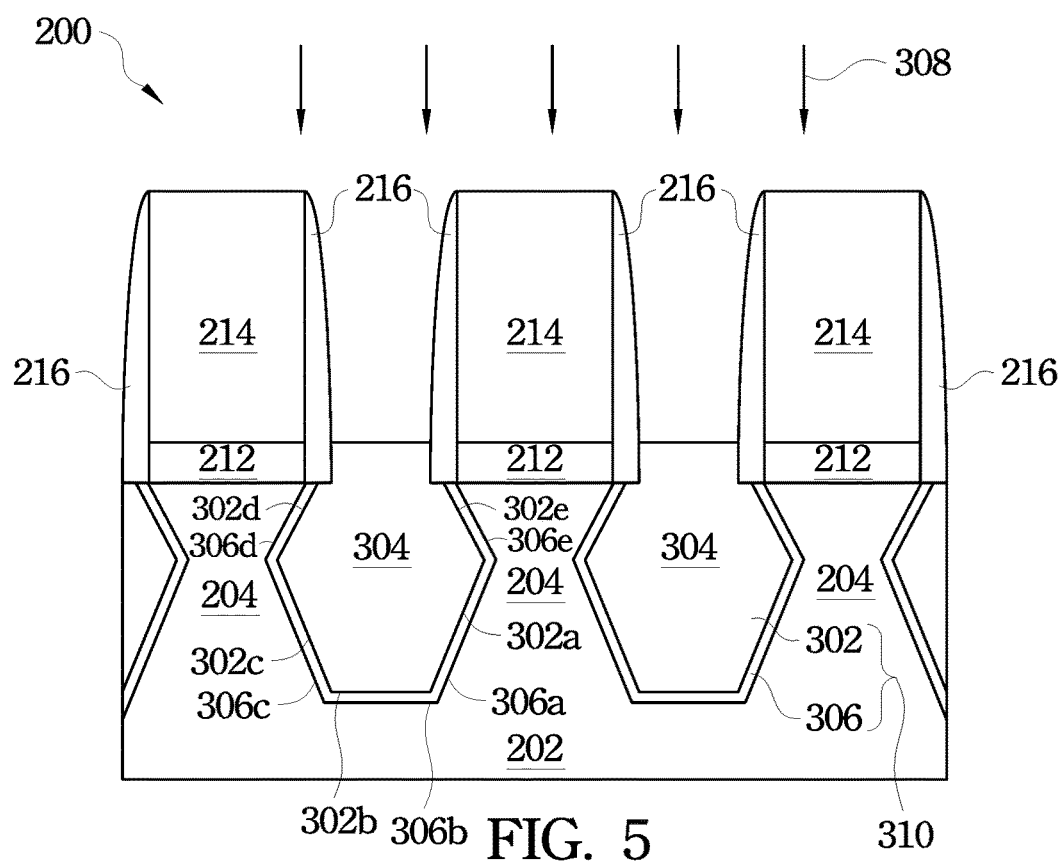

The method 100 in FIG. 1 continues with step 108 in which the structure in FIG. 5 is produced by performing a thermal process 308 to form source/drain (S/D) extensions 306 conformably surrounding the S/D recess cavities 302. The thermal process 308 can drive out boron at the edges of the boron-doped strained material 304 into the active regions 204 to form S/D extensions 306. In the present embodiment, the thermal process 308 to form S/D extensions 306 is performed using rapid thermal annealing, flash annealing, or laser annealing. In one embodiment, the thermal process 308 is performed at a temperature of about 1150 to 1250° C. for a period of time in the range from about 2 ms to about 15 ms. The S/D extensions 306 thus comprise a plurality of portions 306a, 306b, 306c, 306d, 306e along the bottom surface 302b and sidewalls 302a, 302c, 302d, 302e of the S/D recess cavity 302. Thus, the S/D extensions 306 are substantially conformably surrounding the bottom surface 302b and sidewalls 302a, 302c, 302d, 302e of the S/D recess cavity 302. For simplicity and clarity, the S/D recess cavities 302 and S/D extensions 306 are hereinafter also referred to as a strained S/D structure 310.

Figure 6:
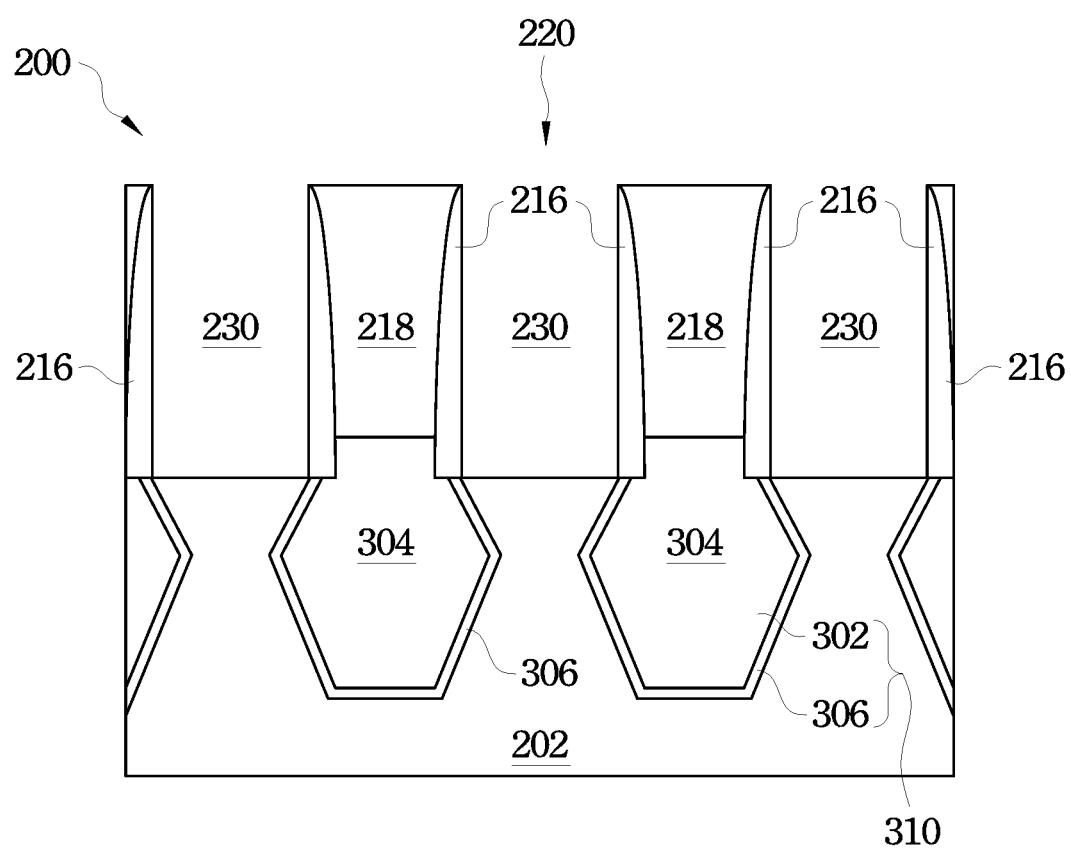

In the present embodiment, an interlayer dielectric (ILD) layer 218 in FIG. 6 is deposited over the dummy gate stack 220, pair of spacers 216, and strained material 304. The ILD layer 218 may comprise a dielectric material. The dielectric material may comprise silicon oxide, phosphosilicate glass (PSG), spin-on glass (SOG), fluorinated silica glass (FSG), carbon doped silicon oxide (e.g., SiCOH), and/or combinations thereof. It is understood that the ILD layer 218 may comprise one or more dielectric materials and/or one or more dielectric layers. In some embodiments, the ILD layer 218 may be deposited over the dummy gate stack 220, pair of spacers 216, and the strained material 304 to a suitable thickness by CVD, high density plasma (HDP) CVD, sub-atmospheric CVD (SACVD), spin-on, sputtering, or other suitable methods. In the present embodiment, the ILD layer 218 comprises a thickness of about 3000 to 4500 Å.

The ILD layer 218 is then planarized using a chemical mechanical polish (CMP) process until a top surface of the dummy gate stack 220 is exposed or reached. The CMP process may have a high selectivity to provide a substantially planar surface for the dummy gate stack 220, pair of spacers 216, and ILD layer 218. Alternatively, the CMP process may be performed to expose the hard mask layer and then an etching process such as a wet etch dip may be applied to remove the hard mask layer thereby exposing the top surface of the dummy gate stack 220.

In a gate last process, the exposed dummy gate stack 220 is removed so that a resulting metal gate stack 320 (shown in FIGS. 8A and 8B) may be formed in place of the dummy gate stack 220. The method 100 in FIG. 1 continues with step 110 in which the structure in FIG. 6 is produced by removing the dummy gate stack 220 to form an opening 230 to expose the substrate 202 under the dummy gate stack 220.

Specifically, after the CMP process, a gate replacement process is performed. The dummy gate stack 220 may be removed by any suitable process to form the opening 230 surrounded with dielectric comprising the pair of spacers 216 and ILD layer 218. Using the pair of spacers 216 as a hard-mask, the dummy gate stack 220 may be removed using a wet etch and/or a dry etch process. In an embodiment, the wet etch process for the dummy poly-silicon gate electrode layer 214 comprises exposure to a hydroxide containing solution (e.g., ammonium hydroxide), deionized water, and/or other suitable etchant solutions. And then, another wet etch process for the dummy gate oxide layer 212 comprises exposure to a HF containing solution.

Figure 7A:
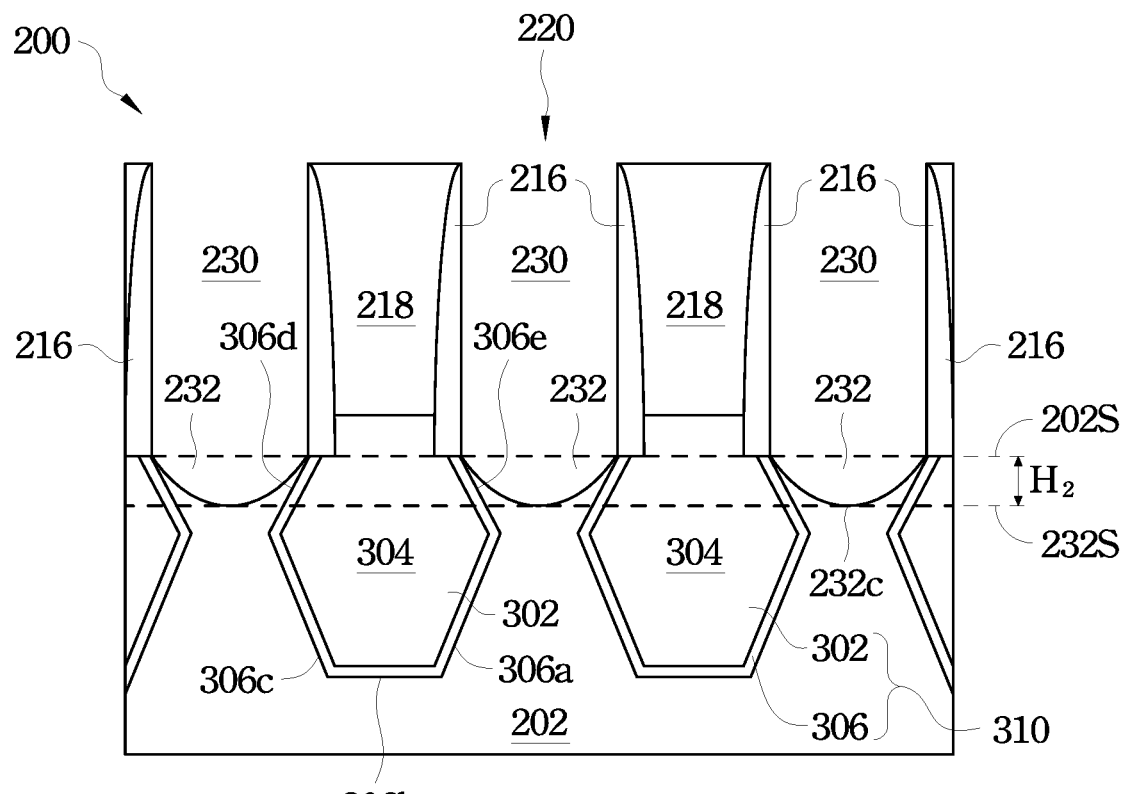
Figure 7B:
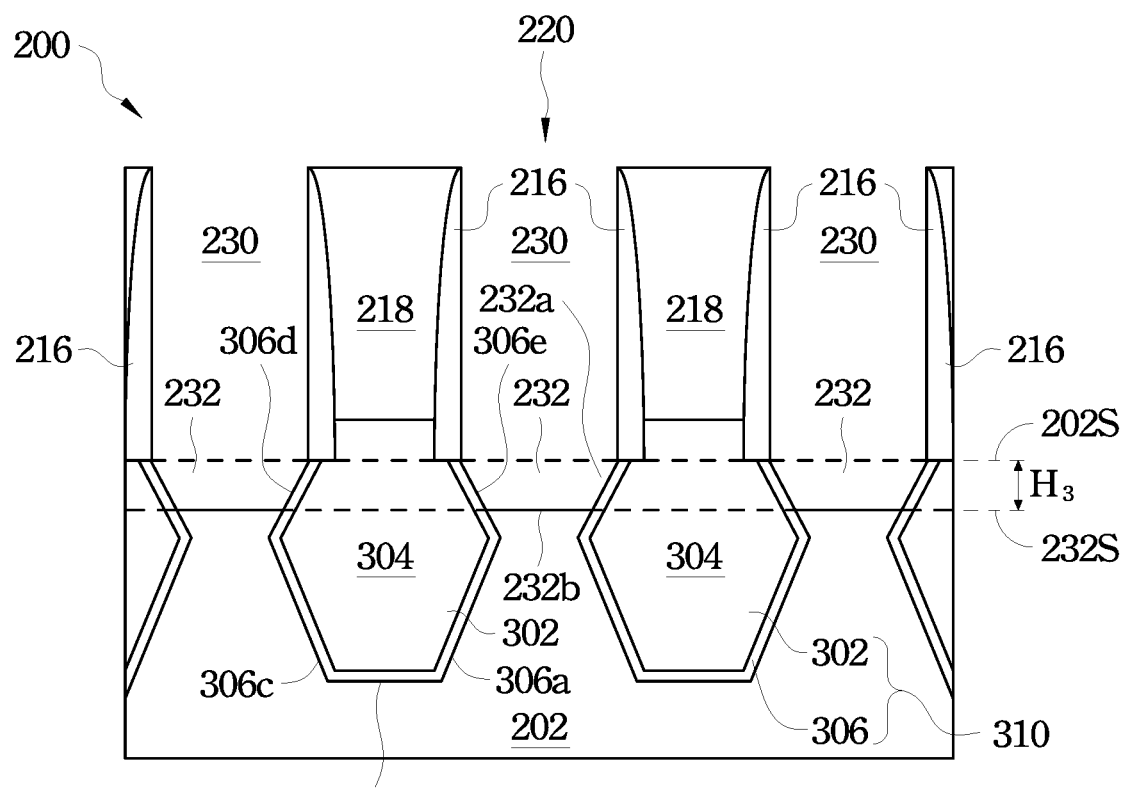

The method 100 in FIG. 1 continues with step 112 in which the structures in FIGS. 7A and 7B are produced by recessing the substrate 202 exposed in the opening 230 to form a channel recess cavity 232 spaced apart from the S/D recess cavities 302. In the present embodiment, using the portions 306d, 306e of the S/D extensions 306 as an etch stop layer, the channel recess cavity 232 can be spaced apart from the S/D recess cavities 302. Further, still using the pair of spacers 216 as a hard-mask, several alternative processes for recessing the substrate 202 to form a channel recess cavity 232 comprising an indentation in the substrate top surface 202s located between the pair of spacers 216 are available.

For example, in one embodiment, the step of recessing the substrate 202 under the opening 230 to form a channel recess cavity 232 is performed using a non-biased dry etching process, resulting in the channel recess cavity 232 having a curved bottom portion 232c (shown in FIG. 7A). The step of the non-biased dry etching process is performed under a temperature of about 40 to 60° C., using $Cl_2$, $NF_3$ and $SF_6$ as etching gases. In some embodiments, a height $H_2$ between the top surface 202s of the substrate 202 and a bottom surface 232s of the channel recess cavity 232 is in the range of about 2 to 12 nm.

In a further alternative embodiment, the step of recessing the substrate 202 under the opening 230 to form a channel recess cavity 232 is performed using a wet etching process, resulting in the channel recess cavity 232 having a bottom portion 232b and tapered sidewalls 232a (shown in FIG. 7B). In one embodiment, the wet etching process comprises recessing the substrate 202 under the opening 230 to form a channel recess cavity 232 in a solution comprising TMAH. In another embodiment, the wet etching process comprises recessing the substrate 202 under the opening 230 to form a channel recess cavity 232 in a solution comprising KOH. In some embodiments, a height $H_3$ between the top surface 202s of the substrate 202 and a bottom surface 232b of the channel recess cavity 232 is in the range of about 2 to 12 nm.

Figure 8A:
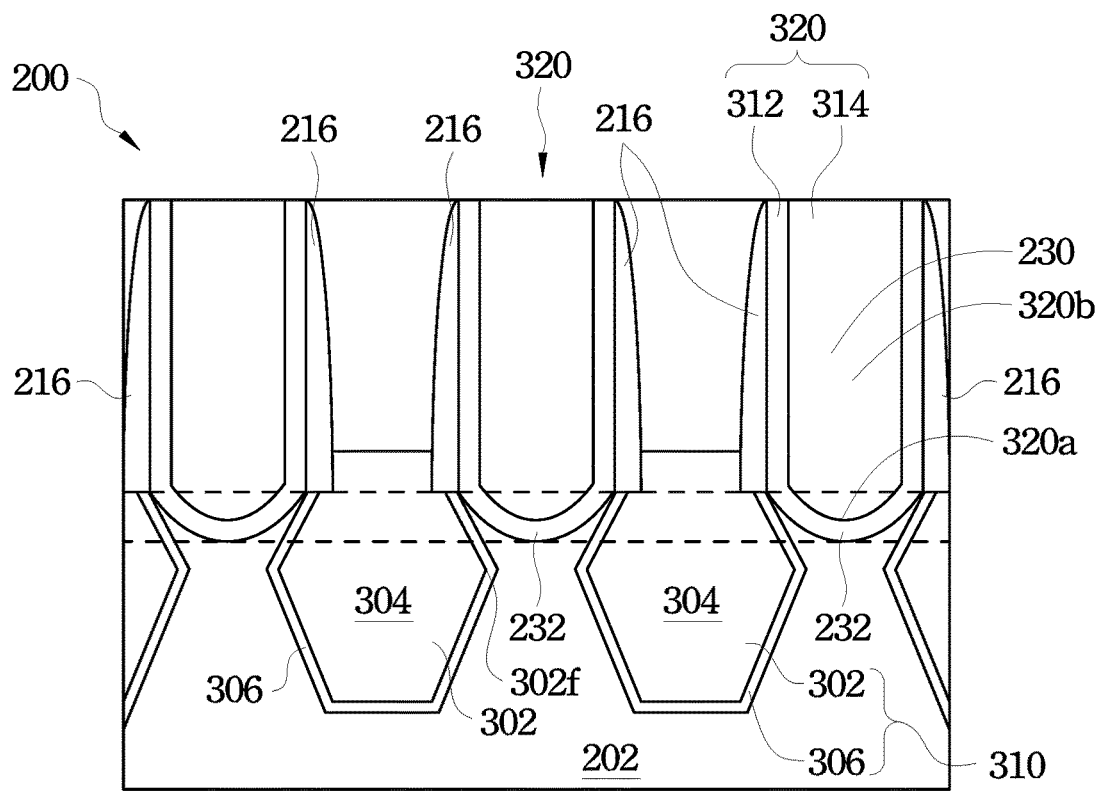
Figure 8B:
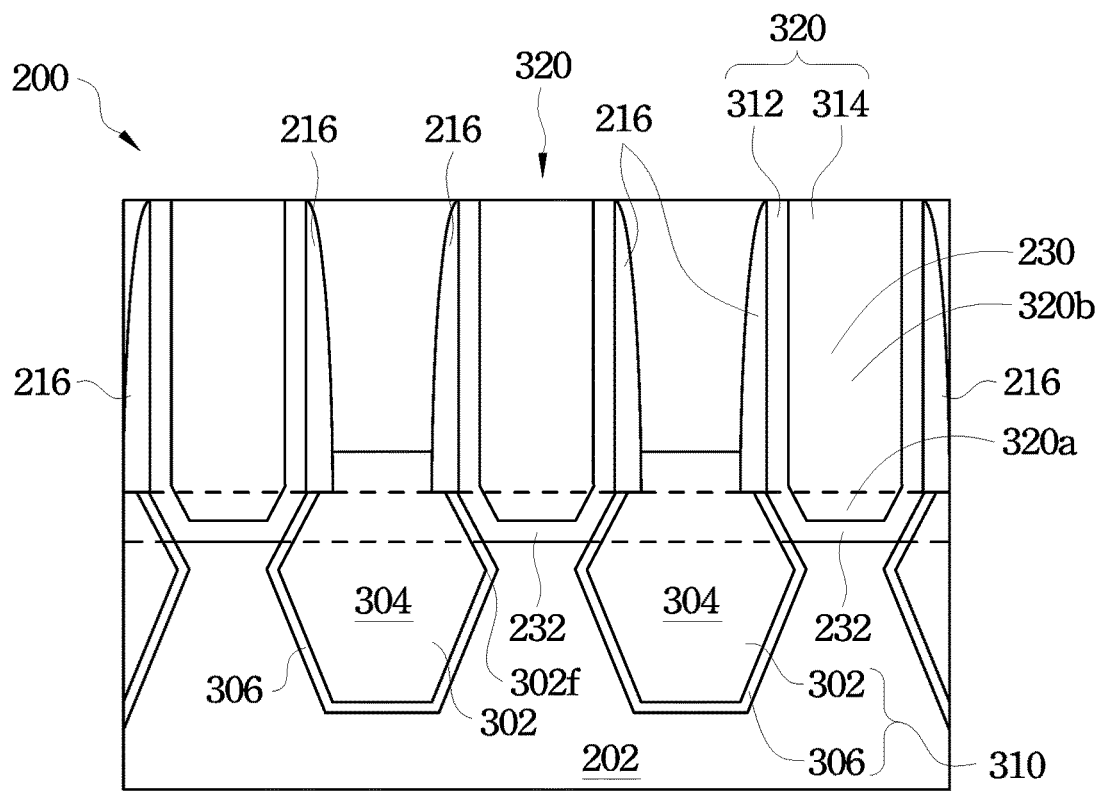

The method 100 in FIG. 1 continues with step 114 in which the structures in FIGS. 8A and 8B are produced by forming a gate stack 320 with a bottom portion 320a in the channel recess cavity 232 and a top portion 320b extending outside the channel recess cavity 232, i.e., extending upwardly beyond the top surface 202s of the substrate 202. In the present embodiment, the gate stack 320 comprises a gate dielectric layer 312 and a metal gate electrode layer 314 over the gate dielectric layer 312. Further, the S/D recess cavity 302 comprises a portion 302f extending below the gate stack 320, i.e., the portion 302f extends, transversely to a thickness direction of the substrate 202, to a position directly below the gate stack 320 when viewed in the thickness direction of the substrate 202. In other words, the portion 302f and the gate stack 320 overlap when viewed in the thickness direction of the substrate 202.

In the present embodiment, the gate dielectric layer 312 is formed over the substrate 202 to partially fill the opening 230 and channel recess cavity 232. In some embodiments, the gate dielectric layer 312 may comprise silicon oxide, high-k dielectric material or combination thereof. A high-k dielectric material is defined as a dielectric material with a dielectric constant greater than that of $SiO_2$. The high-k dielectric layer comprises metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The gate dielectric layer 312 may be grown by a thermal oxidation process, a chemical vapor deposition (CVD) process, an atomic layer deposition (ALD) process, and may have a thickness less than 2 nm.

The gate dielectric layer 312 may further comprise an interfacial layer (not shown) to minimize stress between the gate dielectric layer 312 and the substrate 202. The interfacial layer may be formed of silicon oxide or silicon oxynitride grown by a thermal oxidation process. For example, the interfacial layer can be grown by a rapid thermal oxidation (RTO) process or in an annealing process comprising oxygen.

Then, a metal gate electrode layer 314 may be formed to fill in the opening 230 and channel recess cavity 232. The metal gate electrode layer 314 may be formed by CVD, PVD or other suitable technique. The metal gate electrode layer 314 may include any suitable metal material, including work-function metal layers, signal metal layers, liner layers, interface layers, seed layers, adhesion layers, barrier layers, etc. In the present embodiment, the metal gate electrode layer 314 may include suitable P-work-function metal metals, such as TiN, WN, TaN, or Ru that properly perform in the p-type field effect transistor 200. The metal gate electrode layer 314 may further include suitable signal metal layer comprising a material selected from a group of Al, Cu and W. Another CMP is performed to remove the metal gate electrode layer 314 outsides of the opening 230 to form the gate stack 320. Accordingly, the CMP process may stop when reaching the ILD layer 218, and thus providing a substantially planar surface.

For simplicity and clarity, the metal gate electrode layer 314 and gate dielectric layer 312 are hereinafter also referred to as the gate stack 320 (shown in FIGS. 8A and 8B). The gate stack 320 comprises a bottom portion 320a in the channel recess cavity 232 and a top portion 320b extending outside the channel recess cavity 232. Accordingly, methods of fabricating a p-type field effect transistor 200 in some embodiments may produce the S/D recess cavity 302 comprising a portion 302f extending below the gate stack 320, thereby delivering a given amount of strain into the channel region of the p-type field effect transistor 200 to enhance carrier mobility and upgrade the device performance and yield.

In some embodiments, the p-type field effect transistor 200 may undergo further CMOS processes to form various features such as contacts/vias, interconnect metal layers, dielectric layers, passivation layers, etc. In such embodiments, the modified source/drain (S/D) structure also provides a given amount of strain into the channel region of the transistor, thereby enhancing the device performance.

One aspect of this description relates to a p-type field effect transistor. The p-type field effect transistor includes a substrate having a top surface. The p-type field effect transistor further includes a pair of spacers over the substrate top surface. The p-type field effect transistor further includes a channel recess cavity comprising an indentation in the substrate top surface between the pair of spacers. The p-type field effect transistor further includes a gate stack with a bottom portion in the channel recess cavity and a top portion extending outside the channel recess cavity. The p-type field effect transistor further includes a source/drain (S/D) recess cavity including a bottom surface and sidewalls below the substrate top surface, wherein the S/D recess cavity includes a portion extending below the gate stack. The p-type field effect transistor further includes a strained material filling the S/D recess cavity. The p-type field effect transistor further includes a source/drain (S/D) extension substantially conformably surrounding the bottom surface and sidewalls of the S/D recess cavity, wherein the S/D extension includes a portion disposed between the gate stack and the S/D recess cavity and extending below the gate stack. In at least one embodiment, the channel recess cavity has a bottom portion and tapered sidewalls. In at least one embodiment, the channel recess cavity has a curved bottom portion. In at least one embodiment, a distance between the top surface of the substrate and a bottom surface of the channel recess cavity is in the range of about 2 nanometers (nm) to about 12 nm. In at least one embodiment, a distance between the top surface of the substrate and the bottom surface of the S/D recess cavity is in the range of about 30 nm to about 60 nm. In at least one embodiment, the strained material extends above the top surface of the substrate. In at least one embodiment, the strained material is below or co-planar with the top surface of the substrate. In at least one embodiment, the strained material comprises SiGe.

Another aspect of this description relates to a semiconductor device. The semiconductor device includes a substrate having a top surface. The semiconductor device further includes a gate stack. The gate stack includes a gate dielectric layer, wherein a portion of the gate dielectric layer extends below the top surface of the substrate. The gate stack further includes a gate electrode over the gate dielectric layer. The semiconductor device further includes a source/drain (S/D) structure in the substrate. The S/D structure includes a conformal S/D extension contacting the substrate, wherein the conformal S/D extension protrudes under the gate stack. The S/D structure further includes a strained material separated from the substrate by the conformal S/D extension. In at least one embodiment, the gate dielectric layer contacts the conformal S/D extension. In at least one embodiment, the gate dielectric layer extends above the top surface of the substrate. In at least one embodiment, a portion of the gate electrode is below the top surface of the substrate. In at least one embodiments, the substrate is between the portion of the gate dielectric layer and the conformal S/D extension. In at least one embodiment, a composition of the conformal S/D extension is different from a composition of the strained material.

Still another aspect of this description relates to a semiconductor device. The semiconductor device includes a substrate having a top-most surface. The semiconductor device further includes a gate stack. The gate stack includes a gate dielectric layer, wherein a bottom-most surface of the gate dielectric layer is below the top-most surface of the substrate. The semiconductor device includes a source/drain (S/D) structure in the substrate. The S/D structure includes a conformal S/D extension contacting the substrate, wherein the conformal S/D extension protrudes under the gate stack. The S/D structure further includes a strained material separated from the substrate by the conformal S/D extension, wherein a top-most surface of the strained material is above the top-most surface of the substrate. In at least one embodiment, the gate stack further includes a gate electrode over the gate dielectric layer, and a bottom-most surface of the gate electrode is below the top-most surface of the substrate. In at least one embodiment, the semiconductor device further includes a plurality of spacers over the top-most surface of the substrate, wherein the gate stack is between adjacent spacers of the plurality of spacers. In at least one embodiment, the bottom-most surface of the gate dielectric layer is substantially parallel to the top-most surface of the substrate. In at least one embodiment, the bottom-most surface of the gate dielectric layer is curved. In at least one embodiment, the gate dielectric layer contacts the conformal S/D extension.

While exemplary embodiments have been described, it is to be understood that the disclosure is not limited to the specifically disclosed embodiments. To the contrary, it is intended to cover various modifications and similar arrangements (as would be apparent to those skilled in the art). Therefore, the scope of the appended claims should be accorded the broadest reasonable interpretation so as to encompass all such modifications and similar arrangements.

What is claimed is:

1. A p-type field effect transistor, comprising:
a substrate having a top surface, wherein an entirety of the substrate comprises silicon;
a pair of spacers over the substrate top surface;
a channel recess cavity comprising an indentation in the substrate top surface between the pair of spacers, wherein an outer-most edge of the channel recess cavity at the top surface of the substrate is aligned with a sidewall of a spacer of the pair of spacers;
a gate stack with a bottom portion in the channel recess cavity and a top portion extending outside the channel recess cavity, wherein the gate stack comprises a gate dielectric layer, the gate dielectric layer extends from the channel recess cavity along sidewalls of each of the pair of spacers, and the gate dielectric layer directly contacts the substrate below a top-most surface of the substrate;
a source/drain (S/D) recess cavity comprising a bottom surface and sidewalls below the substrate top surface, wherein the S/D recess cavity comprises a portion extending below the gate stack;
a strained material filling the S/D recess cavity; and
a source/drain (S/D) extension substantially conformably surrounding the bottom surface and sidewalls of the S/D recess cavity, wherein the S/D extension comprises a portion disposed between the gate stack and the S/D recess cavity and extending below the gate stack, a composition of the S/D extension is different from both the strained material and the substrate, and a portion of the substrate between the gate dielectric layer and the S/D extension is coplanar with the top surface of the substrate.

2. The p-type field effect transistor of claim 1, wherein the channel recess cavity has a curved bottom portion.

3. The p-type field effect transistor of claim 1, wherein a distance between the top surface of the substrate and a bottom surface of the channel recess cavity is in the range of about 2 nanometers (nm) to about 12 nm.

4. The p-type field effect transistor of claim 1, wherein a distance between the top surface of the substrate and the bottom surface of the S/D recess cavity is in the range of about 30 nm to about 60 nm.

5. The p-type field effect transistor of claim 1, wherein the strained material extends above the top surface of the substrate.

6. The p-type field effect transistor of claim 1, wherein the strained material comprises SiGe.

7. The p-type field effect transistor of claim 1, wherein an entirety of the gate dielectric layer is spaced from the S/D extension.

8. A semiconductor device comprising:
a substrate having a top surface, wherein an entirety of the substrate comprises silicon;
a gate stack, wherein the gate stack comprises:
a gate dielectric layer, wherein a first portion of the gate dielectric layer extends below the top surface of the substrate, the first portion of the gate dielectric layer directly contacts the substrate, and a second portion of the gate dielectric layer extends above the top surface of the substrate; and
a gate electrode over the gate dielectric layer;
a plurality of spacers, wherein the gate electrode is between adjacent spacers of the plurality of spacers, the second portion of the gate dielectric layer separates the gate electrode from the plurality of spacers, and a bottom-most surface of each spacer of the plurality of spacers is above the top surface; and
a source/drain (S/D) structure in the substrate, wherein the S/D structure comprises:
a conformal S/D extension contacting the substrate, wherein the conformal S/D extension protrudes under the gate stack, wherein, in a direction parallel to the top surface of the substrate, a portion of the substrate directly contacting the first portion of the gate dielectric layer is between the conformal S/D extension and the gate dielectric layer in a direction parallel to the top surface of the substrate; and
a strained material separated from the substrate by the conformal S/D extension.

9. The semiconductor device of claim 8, wherein the gate dielectric layer extends above the top surface of the substrate.

10. The semiconductor device of claim 8, wherein a portion of the gate electrode is below the top surface of the substrate.

11. The semiconductor device of claim 8, wherein the substrate is between the portion of the gate dielectric layer and the conformal S/D extension.

12. The semiconductor device of claim 8, wherein a composition of the conformal S/D extension is different from a composition of the strained material.

13. The semiconductor device of claim 8, wherein the substrate extends between an entirety of the gate dielectric layer and the S/D structure.

14. The semiconductor device of claim 8, wherein the portion of the substrate has a tapered profile.

15. A semiconductor device comprising:
a substrate having a top-most surface, wherein an entirety of the substrate comprises a first composition;
a recess in the substrate, wherein a curvature of the recess is constant;
a gate stack extending into the recess, wherein the gate stack comprises:
a gate dielectric layer, wherein a bottom-most surface of the gate dielectric layer is below the top-most surface of the substrate, a top-most surface of the gate dielectric layer is above the top-most surface of the substrate, a thickness of the gate dielectric layer is substantially constant; and
a source/drain (S/D) structure in the substrate, wherein the S/D structure comprises:
a conformal S/D extension contacting the substrate, wherein the conformal S/D extension protrudes under the gate stack, the conformal S/D extension comprises a second composition different from the first composition, and the gate dielectric directly contacts the substrate at the top-most surface of the substrate; and
a strained material separated from the substrate by the conformal S/D extension, wherein a top-most surface of the strained material is above the top-most surface of the substrate, and the strained material comprises a third composition different from the second composition.

16. The semiconductor device of claim 15, wherein the gate stack further includes a gate electrode over the gate dielectric layer, and a bottom-most surface of the gate electrode is below the top-most surface of the substrate.

17. The semiconductor device of claim 15, further comprising a plurality of spacers over the top-most surface of the substrate, wherein the gate stack is between adjacent spacers of the plurality of spacers.

18. The semiconductor device of claim 15, wherein the bottom-most surface of the gate dielectric layer is curved.

19. The semiconductor device of claim 15, wherein an entirety of the gate dielectric layer is separated from the conformal S/D extension.

20. The semiconductor device of claim 15, wherein a distance between the gate dielectric and the conformal S/D extension varies in a thickness direction.

* * * * *